United States Patent
Temkine et al.

(10) Patent No.: US 9,660,679 B2
(45) Date of Patent: *May 23, 2017

(54) METHOD, SYSTEM AND APPARATUS FOR AUTOMATIC GAIN CONTROL IN DIRECT-CONVERSION RECEIVER

(71) Applicant: PERASO TECHNOLOGIES INC., Toronto (CA)

(72) Inventors: Grigori Temkine, Toronto (CA); Craig Farnsworth, Toronto (CA); Arash Tabibiazar, Toronto (CA); Alexander Tomkins, Toronto (CA); Bradley Robert Lynch, Toronto (CA)

(73) Assignee: PERASO TECHNOLOGIES INC., Toronto (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/219,828

(22) Filed: Jul. 26, 2016

(65) Prior Publication Data

US 2016/0336985 A1   Nov. 17, 2016

Related U.S. Application Data

(63) Continuation of application No. 14/727,494, filed on Jun. 1, 2015, now Pat. No. 9,425,842.

(60) Provisional application No. 62/005,172, filed on May 30, 2014.

(51) Int. Cl.
| | | |
|---|---|---|
| H04L 27/08 | (2006.01) | |
| H04B 1/12 | (2006.01) | |
| H03G 1/00 | (2006.01) | |
| H03G 3/30 | (2006.01) | |

(52) U.S. Cl.
CPC ............... *H04B 1/123* (2013.01); *H03G 1/00* (2013.01); *H03G 3/30* (2013.01); *H03G 3/3052* (2013.01); *H03G 3/3078* (2013.01)

(58) Field of Classification Search
CPC .... H04L 27/08; H03G 3/3068; H03G 3/3078; H03G 3/3089
USPC ........................................................ 375/345
See application file for complete search history.

(56) References Cited

U.S. PATENT DOCUMENTS

| | | | |
|---|---|---|---|
| 8,634,790 B2* | 1/2014 | Peterzell | H03G 3/3068 375/344 |
| 2004/0106380 A1* | 6/2004 | Vassiliou | H04B 17/20 455/73 |

* cited by examiner

*Primary Examiner* — David S Huang
(74) *Attorney, Agent, or Firm* — Parry + Currier Inc.

(57) ABSTRACT

A wireless receiver automatic gain control system includes: a coarse amplification subsystem that receives and amplifies a carrier-modulated signal; a demodulator that generates a baseband signal from the amplified carrier-modulated signal; a fine amplification subsystem that amplifies the baseband signal; and a controller connected to the amplification subsystems. The controller: obtains a unified gain value for the amplification subsystems; based on the unified gain value, selects (i) one of a plurality of coarse gain values defining a set of coarse gain steps each spanning a plurality of unified gain steps, and (ii) one of a plurality of fine gain values defining a set of fine gain steps each spanning a single unified gain step; and sets (i) the gain of the coarse amplification subsystem to the selected coarse gain value, and (ii) the gain of the fine amplification subsystem to the selected fine gain value.

20 Claims, 8 Drawing Sheets

METHOD, SYSTEM AND APPARATUS FOR AUTOMATIC GAIN CONTROL IN DIRECT-CONVERSION RECEIVER

CROSS-REFERENCE TO RELATED APPLICATION

This application is a continuation application of U.S. application Ser. No. 14/727,494, filed Jun. 1, 2015, which claims priority to U.S. provisional application No. 62/005,172, filed May 30, 2014, the entire contents of which are incorporated herein by reference.

FIELD

The specification relates generally to wireless receivers, and specifically to a method, system and apparatus for automatic gain control in a direct-conversion receiver.

BACKGROUND

Wireless receivers are required to receive carrier-modulated signals, amplify and at least partially demodulate the carrier-modulated signals before providing the signals to downstream components for further processing. The selection of appropriate amplification across a wide range of possible amplifications, in the required time period, which can be very short, can introduce undesirable complexity in such receivers.

SUMMARY

According to an aspect of the specification, an automatic gain control system for a wireless receiver is provided, comprising: a coarse amplification subsystem configured to receive a carrier-modulated signal from an antenna and amplify the carrier-modulated signal; a demodulator connected to the coarse amplification subsystem and configured to generate a baseband signal from the amplified carrier-modulated signal; a fine amplification subsystem connected to the demodulator and configured to amplify the baseband signal; a controller connected to the coarse amplification subsystem and the fine amplification subsystem, the controller configured to: obtain a unified gain value for controlling the coarse amplification subsystem and the fine amplification subsystem; based on the unified gain value, select (i) one of a plurality of coarse gain values defining a set of coarse gain steps each spanning a plurality of unified gain steps, and (ii) one of a plurality of fine gain values defining a set of fine gain steps each spanning a single unified gain step; and set (i) the gain of the coarse amplification subsystem to the selected coarse gain value, and (ii) the gain of the fine amplification subsystem to the selected fine gain value.

The controller can be configured to obtain the unified gain value by receiving the unified gain value from a further component connected to the automatic gain control system. The further component can be a baseband processor.

The controller can be configured to obtain the unified gain value by: storing a previous unified gain value; receiving an instruction from the further component to increment or decrement the previous unified gain value; and generating the unified gain value based on the previous unified gain value and the instruction.

The controller can be configured to select the one of the plurality of coarse gain values by: retrieving a first map from a memory, the first map identifying (i) each of the plurality of coarse gain values, and (ii) for each of the plurality coarse gain value, a first plurality of corresponding unified gain values; selecting, from the first map, a first coarse gain value corresponding to the unified gain value.

The controller can be configured to select the one of the plurality of coarse gain values by: retrieving a second map from the memory, the second map identifying (i) each of the plurality of coarse gain values, and (ii) for each of the plurality of coarse gain values, a second plurality of corresponding unified gain values; selecting, from the second map, a second coarse gain value corresponding to the unified gain value; retrieving, from the memory, a previous coarse gain value; and selecting the one of the first coarse gain value and the second coarse gain value that matches the previous coarse gain value.

The controller can be further configured to replace the previous coarse gain value with the selected coarse gain value.

The second plurality of corresponding unified gain values for each coarse gain value can be different from the first plurality of corresponding unified gain values. The first plurality of corresponding unified gain values and the second plurality of corresponding unified gain values can overlap.

The controller can be configured to select the fine gain value based on the selected coarse gain value.

The controller configured to obtain the unified gain value by generating the unified gain value.

The coarse amplification subsystem can include a low noise amplifier. The fine amplification subsystem can include a plurality of variable gain amplifiers. The demodulator can include a mixer connected to the coarse amplification subsystem and to a local oscillator.

The automatic gain control system can include: an output indication subsystem including a plurality of output indicators configured to generate indications of signal strength at the outputs of the mixer and each of the plurality of variable gain amplifiers.

The controller can be configured to generate the unified gain value by: when a change in input signal strength that exceeds a threshold is detected, setting the unified gain value to a maximum value; setting at least one threshold at each output indicator; receiving an indication, from each output indicator, of whether the threshold has been reached; based on the indications received from the output indicators, estimating an input signal strength; and generating the unified gain value based on the estimated input strength.

The controller can be further configured to: obtain a target output signal strength; set at least one threshold at a final one of the output indicators based on the target output signal strength; set the gain of the coarse amplification subsystem and the fine amplification subsystem based on the unified gain value; receive an indication from the final output indicator, of whether the threshold has been reached; and when the threshold has not been reached, adjust the unified gain and repeat the setting and the receiving.

The automatic gain control system can include: an offset compensation subsystem including at least one digital-to-analog converter (DAC) connected to the controller, configured to compensate for offset introduced by at least one of self-mixing at the mixer and component mismatch.

The offset compensation subsystem can include a plurality to DACs connected, respectively, to the output of the mixer and the output of at least one of the variable gain amplifiers.

The controller can be further configured to: based on the selected coarse gain value, retrieve, from the memory, an offset control value for each of the plurality of DACs; and control the plurality of DACs based on the retrieved offset control values.

According to another aspect of the specification, a method is provided in an automatic gain control system for a wireless receiver having a coarse amplification subsystem configured to receive a carrier-modulated signal from an antenna and amplify the carrier-modulated signal; a demodulator connected to the coarse amplification subsystem and configured to generate a baseband signal from the amplified carrier-modulated signal; a fine amplification subsystem connected to the demodulator and configured to amplify the baseband signal; and a controller connected to the coarse amplification subsystem and the fine amplification subsystem, the method comprising: obtaining a unified gain value for controlling the coarse amplification subsystem and the fine amplification subsystem; based on the unified gain value, selecting (i) one of a plurality of coarse gain values defining a set of coarse gain steps each spanning a plurality of unified gain steps, and (ii) one of a plurality of fine gain values defining a set of fine gain steps each spanning a single unified gain step; and setting (i) the gain of the coarse amplification subsystem to the selected coarse gain value, and (ii) the gain of the fine amplification subsystem to the selected fine gain value.

Selecting the one of the plurality of coarse gain values can include: retrieving a first map from a memory, the first map identifying (i) each of the plurality of coarse gain values, and (ii) for each of the plurality coarse gain value, a first plurality of corresponding unified gain values; and selecting, from the first map, a first coarse gain value corresponding to the unified gain value.

Selecting the one of the plurality of coarse gain values can include: retrieving a second map from the memory, the second map identifying (i) each of the plurality of coarse gain values, and (ii) for each of the plurality of coarse gain values, a second plurality of corresponding unified gain values; selecting, from the second map, a second coarse gain value corresponding to the unified gain value; retrieving, from the memory, a previous coarse gain value; and selecting the one of the first coarse gain value and the second coarse gain value that matches the previous coarse gain value.

Obtaining the unified gain value can include: when a change in input signal strength that exceeds a threshold is detected, setting the unified gain value to a maximum value; setting at least one threshold at each of a plurality of output indicators; receiving an indication, from each output indicator, of whether the threshold has been reached; based on the indications received from the output indicators, estimating an input signal strength; and generating the unified gain value based on the estimated input strength.

The method can further include: obtaining a target output signal strength; setting at least one threshold at a final one of the output indicators based on the target output signal strength; setting the gain of the coarse amplification subsystem and the fine amplification subsystem based on the unified gain value; receiving an indication from the final output indicator, of whether the threshold has been reached; and when the threshold has not been reached, adjusting the unified gain and repeat the setting and the receiving.

The method can further include: based on the selected coarse gain value, retrieving an offset control value for each of a plurality of offset compensation digital-to-analog converters (DACs); and controlling the plurality of DACs based on the retrieved offset control values.

BRIEF DESCRIPTIONS OF THE DRAWINGS

Embodiments are described with reference to the following figures, in which.

DETAILED DESCRIPTION OF THE EMBODIMENTS

Figure 1:
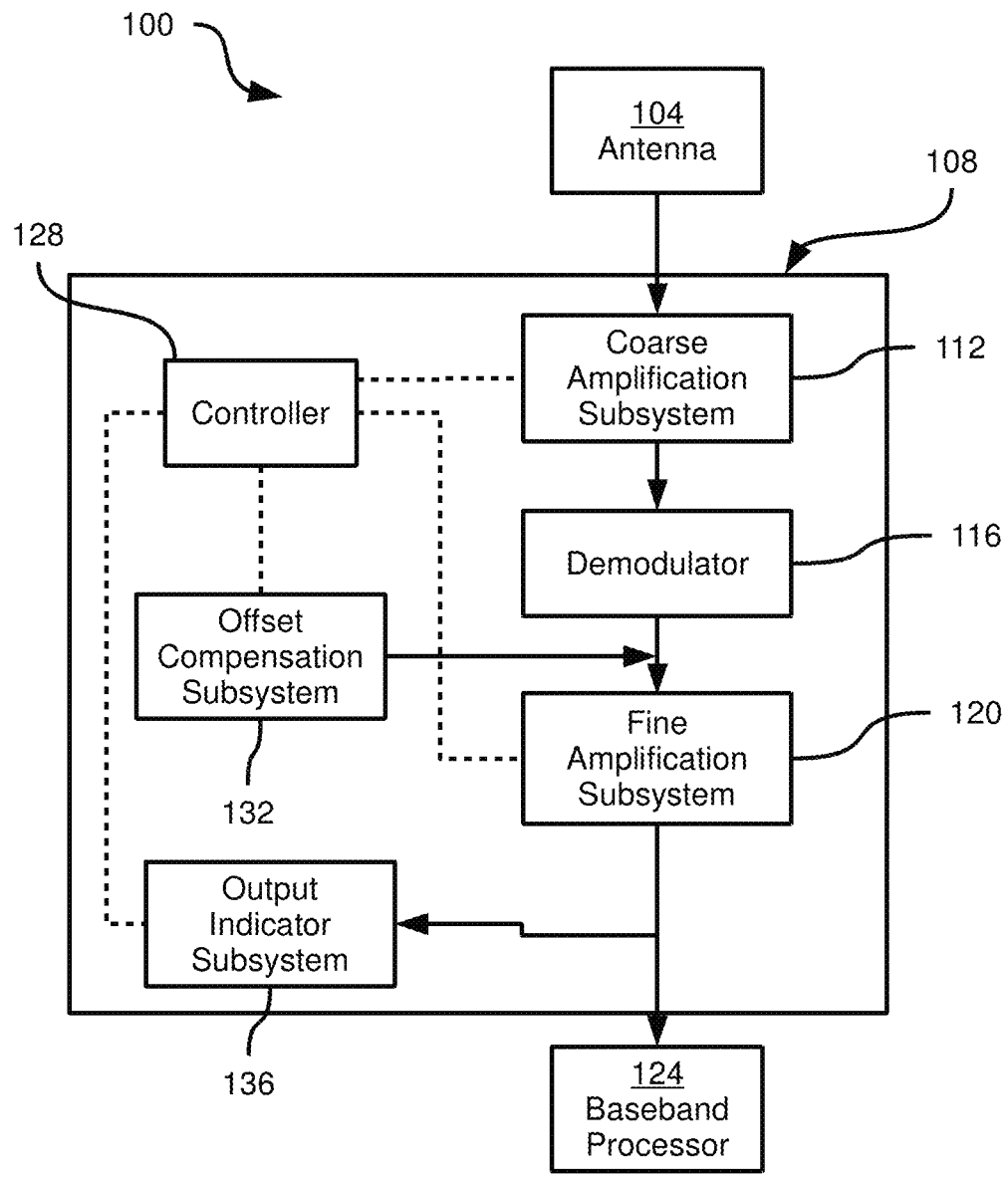
FIG. 1 depicts a wireless receiver system, according to a non-limiting embodiment.

FIG. 1 depicts a wireless receiver system 100. System 100 can be based on any suitable wireless standard; in the present example, system 100 is configured for operation according to the IEEE 802.11ad (also referred to as WiGig) wireless standard, which operates at frequencies of around 60 GHz. Related components, such as transmitter hardware, are not shown in FIG. 1 for simplicity of illustration.

System 100 includes an antenna 104 of any suitable configuration. Antenna 104 receives carrier-modulated signals, and provides the carrier-modulated signals to an automatic gain control (AGC) system 108. AGC system 108, in turn, includes a coarse amplification subsystem 112 that is configured to receive the carrier-modulated signal from an antenna and amplify the carrier-modulated signal.

AGC system 108 also includes a demodulator 116 connected to the coarse amplification subsystem 112. Demodulator 116 is configured to generate a baseband signal from the amplified carrier-modulated signal received from the coarse amplification subsystem. That is, receiver system 100 is a direct-conversion (also referred to as zero intermediate modulation, or zero IF) receiver system. AGC system 108 further includes a fine amplification subsystem 120 connected to the demodulator. The fine amplification subsystem is configured to receive the baseband signal from the demodulator, amplify the baseband signal, and transmit the amplified baseband signal for further processing (for example, to one or more baseband processors 124).

AGC system 108 also includes a controller 128 connected to (among other components) coarse amplification subsystem 112 and fine amplification subsystem 120. As will be discussed in greater detail below, controller 128 is configured to perform various actions to control the level of amplification provided by coarse amplification subsystem 112 and fine amplification subsystem 120. More specifically, controller 128 is configured to exert the above-mentioned control in order to meet the requirements of the wireless standard implemented by system 100 (e.g. the 802.11 ad, in the present example).

In addition, AGC system 108 can also include an offset compensation subsystem 132. As will be discussed below in greater detail, offset compensation subsystem 132 is configured, in response to control signals from controller 128, to apply offset compensation signals at least to the baseband signal emitted by demodulator 116. AGC system 108 can further include an output indicator subsystem 136, for providing an indication of the output of fine amplification subsystem 120 to controller 128. As will be seen below, output indicator subsystem 136 can also provide controller 128 with additional indications of signal levels within AGC system 108.

Figure 2:
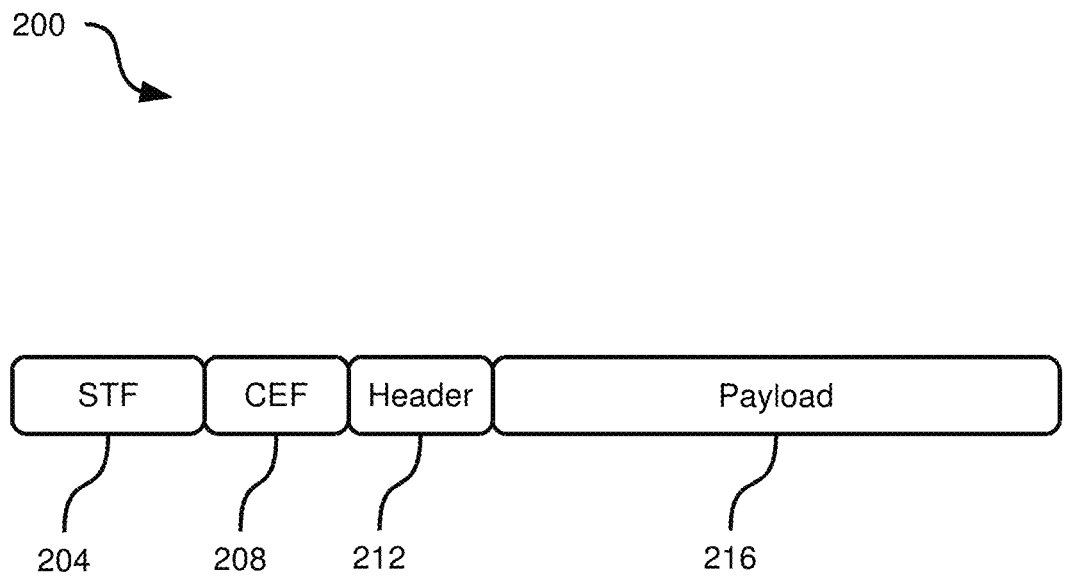
FIG. 2 depicts an example packet structure received by the system of FIG. 1, according to a non-limiting embodiment.

Referring briefly to FIG. 2, an example packet 200 according to the 802.11ad standard is depicted, illustrating some of the requirements of the standard. Packet 200 includes a short training field (STF) 204 containing predetermined repeating signal patterns, such as Golay complementary sequences. The duration of STF 204 defines the time period during which AGC system 108 is expected to settle on an appropriate gain (i.e. level of amplification between the carrier-modulated signal received from antenna 104 and the amplified baseband signal output by fine amplification subsystem 120) that will allow baseband processor 124 to process packet 200.

In the 802.11ad standard, STF 204 has a length of about 1.2 microseconds. STF 204 is followed by a channel estimation field 208, a header 212, and a payload 216. If the gain of AGC system 108 is not settled by the beginning of CEF 208, subsequent processing of packet 200 may be impeded or rendered impossible.

Figure 3A:
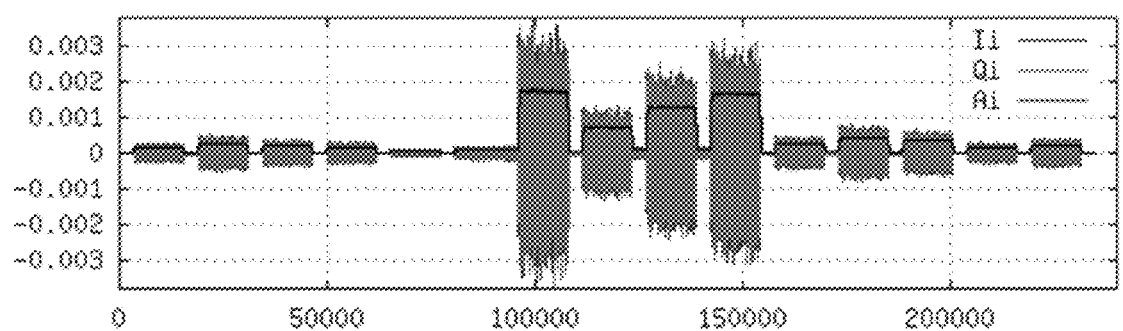
FIGS. 3A and 3B depict example packet sequences illustrating dynamic power range before gain convergence, and after gain convergence, respectively, according to a non-limiting embodiment.
Figure 3B:
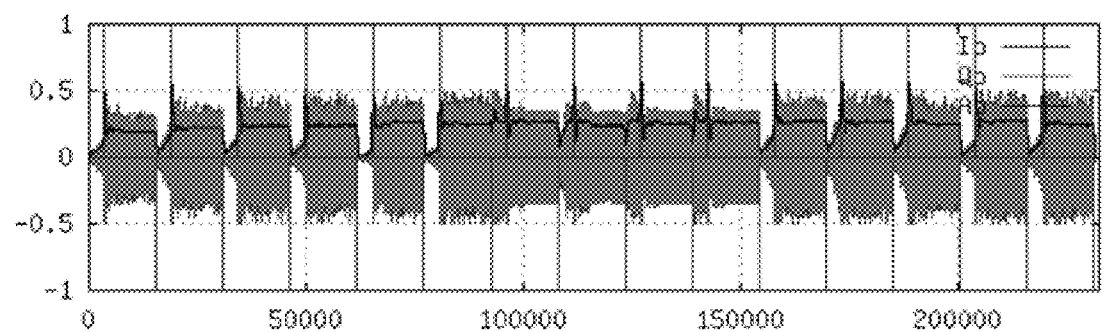

In addition, incoming packets such as packet 200 can have a wide variety of signal strengths, as shown in FIG. 3A. In particular, FIG. 3A depicts the amplitudes (y-axis) of a series of packets (x-axis). As is clear from FIG. 3A, the dynamic range of the series of packets can be considerable, and there may not be any correlation between the amplitudes of adjacent packets. For example, the 802.11 ad standard requires that receiver 100 be capable of receiving packets across a dynamic range of powers of about −78 dBm to −33 dBm, and amplifying the packets to a substantially consistent power, as shown in FIG. 3B.

Figure 4:
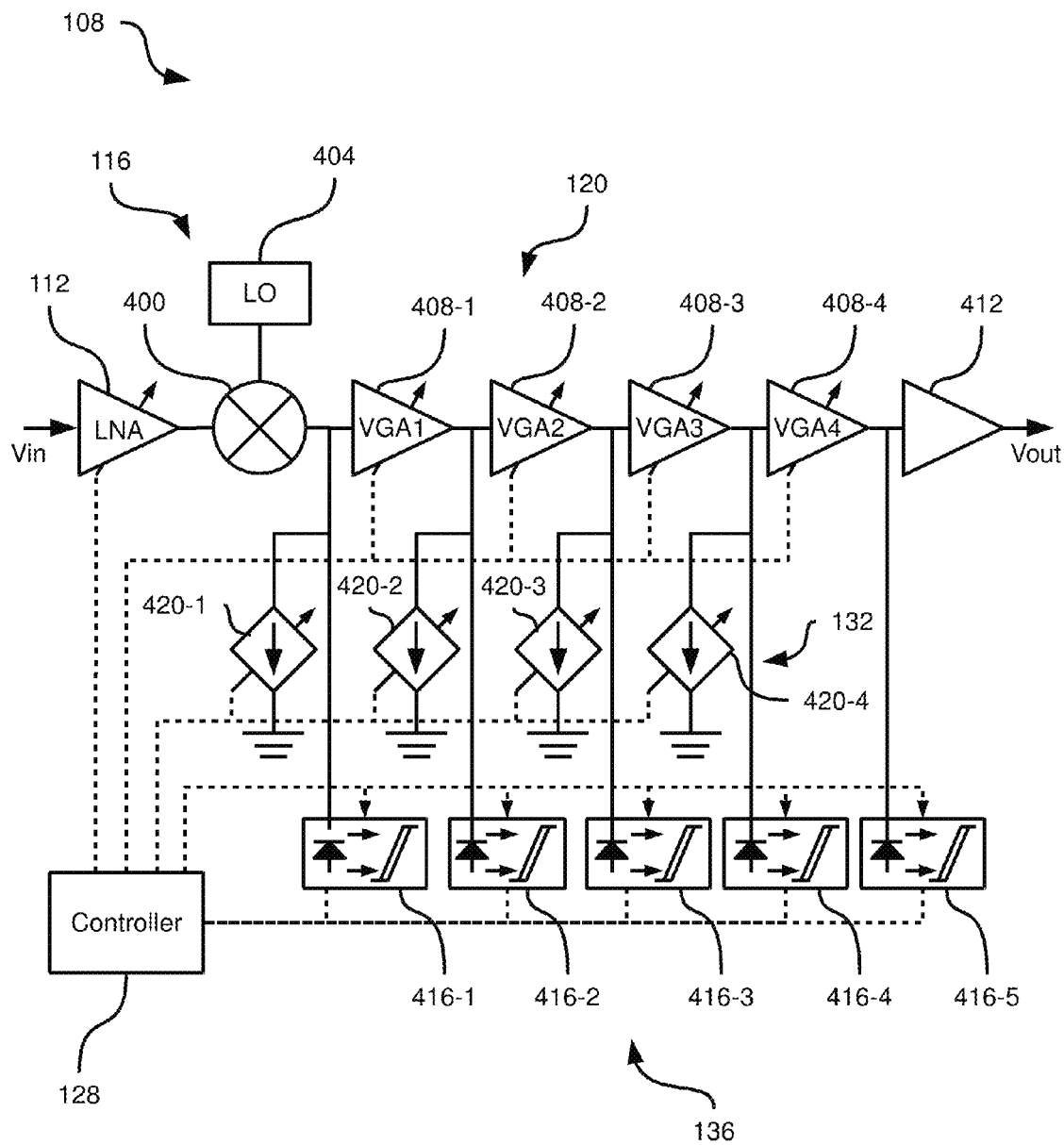
FIG. 4 depicts an example implementation of an automatic gain control system for the wireless receiver system of FIG. 1, according to a non-limiting embodiment.

Various configurations for AGC system 108 are contemplated to achieve gain control over a wide dynamic range such as that mentioned above, as well as the requirement for rapid gain settling. Turning now to FIG. 4, an example configuration for AGC system 108 is depicted.

As seen in FIG. 4, coarse amplification subsystem 112 can be implemented as a digitally controlled low noise amplifier (LNA) connected to controller 128. Demodulator 116 can include a mixer 400 connected to LNA 112 and to a local oscillator (LO) 404. Mixer 400 receives as inputs the amplified carrier-modulated signal from LNA 112, and a signal having a frequency equal to the carrier frequency from LO 404. The output of mixer 400 is therefore a baseband signal.

In the embodiment shown in FIG. 4, fine amplification subsystem 120 includes a plurality of digitally-controlled variable gain amplifiers (VGA) 408-1, 408-2, 408-3 and 408-4 (collectively referred to herein as VGAs 408, and generically as a VGA 408; similar nomenclature will be used for other components). Although four VGAs 408 are illustrated, it is contemplated that other numbers (greater or smaller than four, and preferably greater than one) of VGAs 408 can be provided in other embodiments. VGAs 408 are connected in series between mixer 400 and an output driver 412 (e.g. a 50-Ohm output driver). Each VGA 408 can be a differential heterojunction bipolar transistor (HBT) amplifier cell, with programmable emitter degeneration (e.g. via a bank of switched resistors, not shown, placed across the differential node of each VGA 408).

Output indication subsystem 136 can be implemented as a plurality of output indicators 416-1, 416-2, 416-3, 416-4 and 416-5, connected to the outputs of mixer 400 and each VGA 408, respectively. Each output indicator 416 includes a peak detector and a comparator, and is connected to controller 128 for indicating to controller 128 whether a reference voltage (or, as will be seen below, a plurality of reference voltages) has been reached by the signal at the output to which the respective output indicator 416 is connected. As will be seen below in greater detail, output indicators 416 are employed in various gain-control processes implemented by controller 128.

Offset compensation subsystem 132 can be implemented as a plurality of digitally-controlled current steering digital-to-analog converters (DACs) 420-1, 420-2, 420-3 and 420-4. As will be seen below, DACs 420 are configured to apply offset compensation signals to the outputs of, respectively, mixer 400 and at least a selection of VGAs 408. A greater or smaller number of DACs 420 can be provided, and the number of DACs 420 need not be equal to the number of VGAs 408.

Controller 128 can include any suitable, or any suitable combination of, integrated circuits. Controller 128 includes, or is otherwise connected to, a non-transitory computer-readable storage medium in the form of a memory. The memory can store computer-readable instructions executable by controller 128 for performing various actions described herein, as well as various data employed by controller 128 during such execution.

It is contemplated that certain components of AGC system 108 can be duplicated, depending on the nature of the carrier-modulated signal received at antenna 104. For example, for I/Q (i.e. quadrature) carrier-modulated signals, separate subsystems can be provided for the I and Q channels. For example, in the implementation of FIG. 4, a single LNA 112 may be provided (receiving the carrier-modulated signal from antenna 104). However, separate mixers 400, fine amplification subsystems 120 (e.g. sets of VGAs 408), output indication subsystems (e.g. sets of output indicators 416) and output drivers 412 can be provided for each of the I and Q channels.

The operation of AGC system 108 will be described below. The operation of AGC system 108 is described in connection with the implementation shown in FIG. 4; however, it is contemplated that the discussion below can also be applied to other implementations of AGC system 108.

Figure 5:
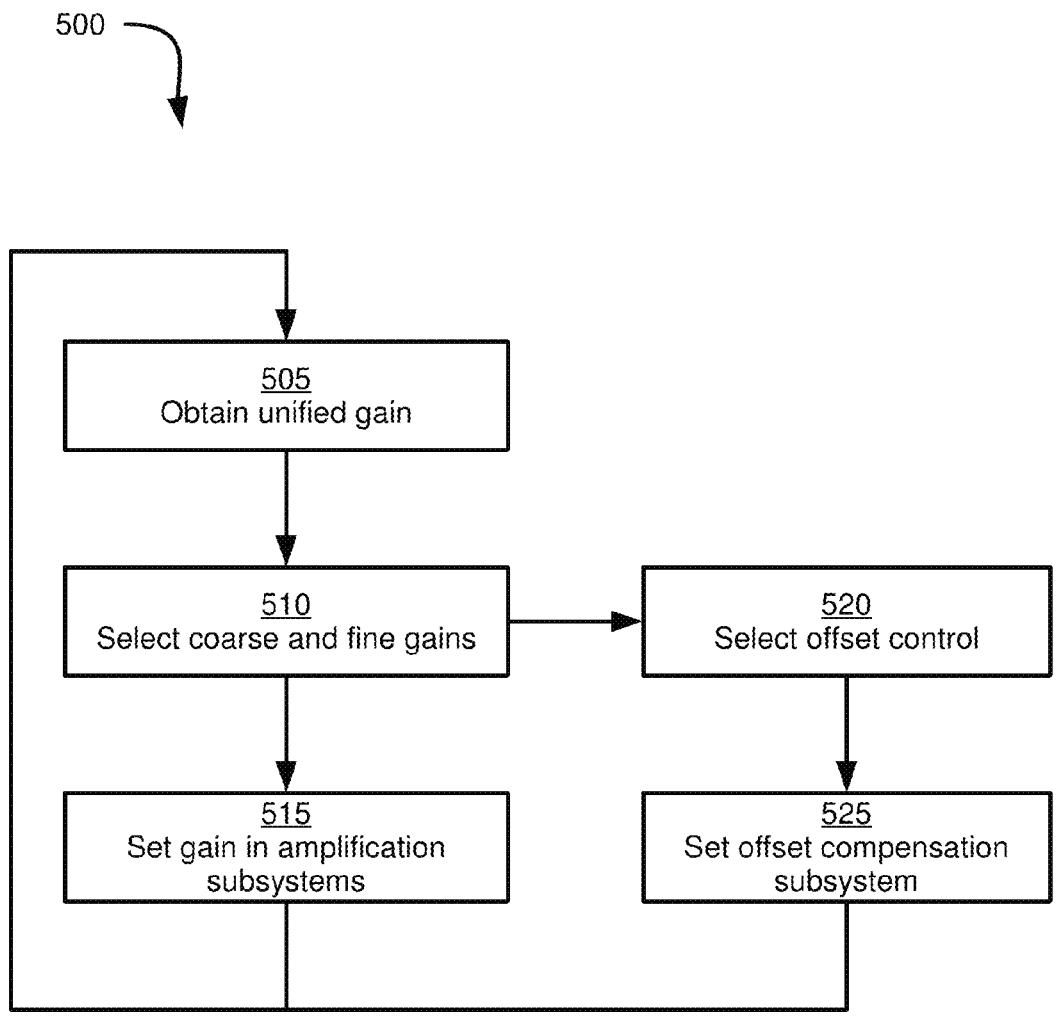
FIG. 5 depicts a method of automatic gain control, according to a non-limiting embodiment.

Referring now to FIG. 5, a method 500 of gain control in AGC 108 is depicted. The blocks of method 500 are performed by controller 128, for example via the execution of the above-mentioned computer-readable instructions stored in memory. At block 505, controller 128 is configured to obtain a unified gain value for controlling both coarse amplification subsystem 112 and fine amplification subsystem 120. That is, rather than obtaining separate control values for each of coarse amplification subsystem 112 and fine amplification subsystem 120, controller 128 is configured to obtain a single control value representing the gain of coarse amplification subsystem 112 and fine amplification subsystem 120 in combination. As will be seen below, controller 128 is then configured to control coarse amplification subsystem 112 and fine amplification subsystem 120 to achieve the overall unified gain value obtained at block 505.

Various mechanisms are contemplated for obtaining the unified gain value at block 505. In some embodiments, controller 128 can generate the unified gain value internally; such embodiments will be discussed in greater detail below in connection with FIG. 8. In other embodiments, controller 128 can be configured to obtain the unified gain value from another component of system 100, such as baseband processor 124. For example, baseband processor 124 can be configured to determine a desired overall gain to be applied to the incoming signal by AGC system 108, and send the desired gain to controller 128. As a further example, baseband processor 124 can be configured to send instructions to controller 128 to simply increase or decrease the current unified gain applied in AGC system 108. In such examples, controller 128 can obtain the unified gain value by storing the most recently applied unified gain value, and incrementing or decrementing that value based on the instructions received from baseband processor 124.

Having obtained a unified gain value at block 505, controller 128 is configured to decompose the unified gain value by selecting two further gain values: (1) a coarse controlled gain value, selected from a plurality of coarse controlled gain values defining a set of coarse gain steps each spanning a plurality of unified gain steps; and (2) a fine controlled gain value, selected from a plurality of fine controlled gain values defining a set of fine gain steps each spanning a single unified gain step.

The full range of gain control that AGC system 108 is capable of applying to the incoming carrier-modulated signal can be divided into a plurality of substantially even unified gain steps. As will now be apparent to those skilled in the art, a portion of the full range of gain that can be applied by AGC 108 is provided by coarse amplification subsystem 112, while the remainder of the full range of gain applied by AGC 108 is provided by fine amplification subsystem 120. By way of example, assume that AGC system 108 can apply a maximum of about 78 dB of gain to the incoming carrier-modulated signal. That full range can be divided into any number of substantially even unified gain steps. For instance, in an example embodiment, the full gain range can be divided into a total of 99 unified gain steps (specified by unified gain values from 1 to 100), with each equivalent to a true gain step about 0.8 dB. A wide variety of other unified gain ranges and corresponding true gain steps can be implemented.

The portion of the full range of gain applied by AGC system 108 (e.g. 78 dB) that is provided by coarse amplification subsystem 112 can span a plurality of the above-mentioned unified gain steps. For example, assume that coarse amplification subsystem 112 is capable of applying a maximum gain of about 28 dB. The maximum gain of 28 dB corresponds to about 36 of the above-mentioned unified gain steps. However, the set of coarse controlled gain values available for selection by controller 128 at block 510 is smaller than the plurality of unified gain steps spanned by the maximum gain that coarse amplification subsystem 112 is capable of applying. For example, although LNA 112 may be capable of applying a total gain spanning 36 unified gain steps, controller 128 can be configured to select from only four coarse controlled gain values defining three coarse gain steps. Each coarse gain step would therefore span about 12 unified gain steps.

It is clear from the above that the remaining portion of the full range of gain for AGC system 108 is provided by fine amplification system 120. Thus, continuing with the example introduced above, given that coarse amplification subsystem 112 can apply a maximum gain of about 28 dB out of the total 78 dB of which AGC system 108 is capable, fine amplification subsystem 120 can therefore apply about 50 dB of gain. As will now be apparent, the gain provided by fine amplification subsystem 120 corresponds to 63 unified gain steps (at about 0.8 dB per unified gain step), which can be represented by a plurality of 6-bit values. In contrast to the coarse controlled gain values available for selection by controller 128, the plurality of fine controlled gain values available for selection by controller 128 define fine gain steps that are equal in size to the unified gain steps. Thus, when fine amplification subsystem 120 is capable of applying a maximum gain of 50 dB, corresponding to 63 unified gain steps, controller 128 is configured to select from a plurality of 63 fine gain steps.

Figure 6:
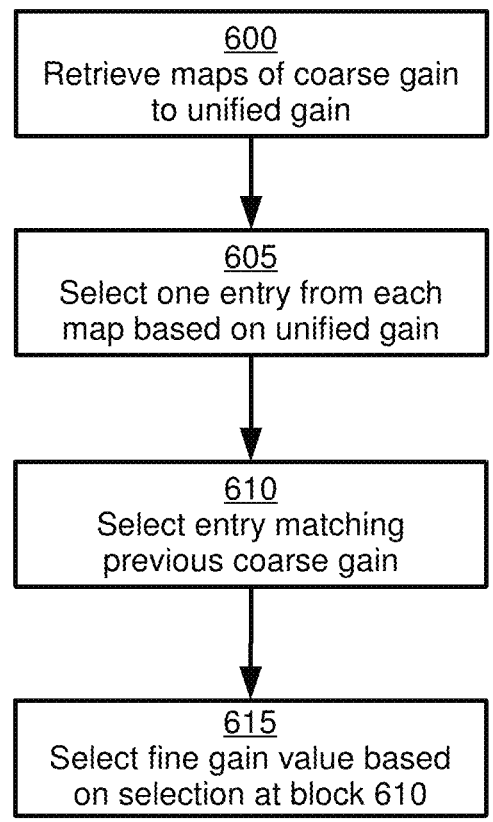
FIG. 6 depicts a method of selecting gain values from a unified gain, according to a non-limiting embodiment.

Controller 128 can select the coarse and fine controlled gain values in a variety of ways. Turning to FIG. 6, a method of selecting coarse and fine controlled gain values (that is, of implementing block 510 of method 500) is depicted. Beginning at block 600, controller 128 is configured to retrieve, from memory, at least one map of coarse controlled gain values to corresponding unified gain values. The map identifies each of the available coarse controlled gain values, and for each coarse controlled gain value, identifies a plurality of corresponding unified gain values.

In the present example, a hysteretic pair of maps is retrieved from memory (also referred to as "up" and "down" maps). As discussed below, each of the hysteretic pair of maps identifies a different plurality of unified gain values as corresponding to each coarse controlled gain value. Tables 1 and 2 below are examples of the pair of hysteretic maps.

TABLE 1

First ("Up") Unified to Coarse Controlled Gain Map

| Unified Gain Value | Coarse Controlled Gain Value |
|---|---|
| 1 | 0 |
| (2-41) | 0 |
| 42 | 1 |
| 43 | 1 |
| (44-53) | 1 |
| 54 | 2 |
| 55 | 2 |
| (56-65) | 2 |
| 66 | 3 |
| 67 | 3 |
| (68-98) | 3 |
| 99 | 3 |

TABLE 2

Second ("Down") Unified to Coarse Controlled Gain Map

| Unified Gain Value | Coarse Controlled Gain Value |
|---|---|
| 1 | 0 |
| (2-31) | 0 |
| 32 | 1 |
| 33 | 1 |
| (34-43) | 1 |
| 44 | 2 |
| 45 | 2 |
| (46-55) | 2 |
| 56 | 3 |
| 57 | 3 |

TABLE 2-continued

Second ("Down") Unified to Coarse Controlled Gain Map

| Unified Gain Value | Coarse Controlled Gain Value |
|---|---|
| (58-98) | 3 |
| 99 | 3 |

As seen above, each map includes a total of 99 entries (one for each unified gain value). Each entry identifies a unified gain value and a corresponding coarse controlled gain value. In other words, each table identifies each available coarse controlled gain value (e.g. 0, 1, 2, 3) and for each coarse controlled gain value, identifies a plurality of unified gain values. For example, Table 1 identifies the unified gain values 1-41 as corresponding to coarse controlled gain value 0. As also seen from the above examples, the two maps identify different sets of corresponding unified gain values for each coarse controlled gain value. For example, Table 2 identifies the unified gain values 1-31 as corresponding to coarse controlled gain value 0, and the unified gain values 32-43 as corresponding to coarse controlled gain value 1, in contrast to Table 1.

At block 605, controller 128 is configured to select the coarse controlled gain values from each map corresponding to the unified gain value obtained at block 505. Thus, if the unified gain value were 40, controller 128 would select the coarse controlled gain values 0 and 1 from Tables 1 and 2, respectively.

In other embodiments, more space-efficient implementations of the maps may be provided by storing only the transition unified gain values and corresponding coarse controlled gain values, thus compressing each table to four entries. The transition unified gain values are the unified gain values at which the corresponding coarse controlled gain values change. For example, Tables 1 and 2 can be modified as shown below in Tables 1A and 2A, respectively:

TABLE 1A

Compressed "Up" Unified to Coarse Controlled Gain Map

| Unified Gain Transition | Coarse Controlled Gain Value |
|---|---|
| 1 | 0 |
| 42 | 1 |
| 54 | 2 |
| 66 | 3 |

TABLE 2A

Compressed ("Down") Unified to Coarse Controlled Gain Map

| Unified Gain Transition | Coarse Controlled Gain Value |
|---|---|
| 30 | 0 |
| 42 | 1 |
| 54 | 2 |
| 99 | 3 |

Controller 128, at block 605, can thus be configured to select the coarse controlled gain value corresponding to the unified gain transition that is closest to, but not greater than, the unified gain obtained at block 505. Controller 128 can also be configured, at block 605, to select the coarse controlled gain value corresponding to the unified gain transition that is closest to, but not smaller than, the unified gain obtained at block 505.

Having selected the coarse controlled gain values, at block 610 controller 128 is configured to retrieve from memory the previous coarse controlled gain value (i.e. the most recently applied to coarse amplification subsystem 112) for comparison to the coarse controlled gain values selected at block 605. Controller 128 is configured, at block 610, to select the one of the two values from block 605 that matches, or is closest to, the previous coarse controlled gain value. In other words, the coarse controlled gain value selected at block 610 is dependent on the past coarse controlled gain value, and thus coarse controlled gain control varies depending on the direction in which unified gain is changing (i.e. up or down). That is, the selection of a coarse controlled gain value as described above provides hysteresis in the control of AGC system 108.

The selection of a coarse controlled gain value at block 610 can include, in some embodiments, the retrieval from memory of a final control value for coarse amplification subsystem 112, that corresponds to the coarse controlled gain value. For example, referring to Table 3, controller 128 can be configured (e.g. at block 610) to select the coarse controlled gain control value corresponding to the selected coarse controlled gain value. Thus, the coarse controlled gain value mentioned above can act as an index, or key, to the actual control values to be sent from controller 128 to coarse amplification subsystem 112. In other embodiments, such control values can themselves be used as the index or key. Although the control values below are shown in decibels, in other embodiments control values can be stored in any suitable form (e.g. a 5-bit control value, a voltage gain value, and the like).

Following the example above, in which the unified gain value at block 505 is 40 (corresponding to about 32 dB), and assuming that the previous coarse controlled gain value was 1, the coarse controlled gain value selected at block 510 will be 1, and coarse amplification subsystem will be controlled to an actual gain of about 9 dB.

TABLE 3

Coarse Controlled Gain Value and Corresponding Control Values

| Coarse Controlled Gain Value | Coarse Gain Control (dB) |
|---|---|
| 0 | 0 |
| 1 | 9 |
| 2 | 18 |
| 3 | 28 |

Having selected a coarse controlled gain value at block 610, at block 615 controller 128 is configured to select a fine controlled gain value based on the selection at block 610. Specifically, the selected coarse controlled gain value accounts for a portion of the unified gain obtained at block 505. Thus, the fine controlled gain value selected at block 615 must account for the remainder of the unified gain obtained at block 505. Controller 128 can select a fine controlled gain value in a variety of ways. For example, the above tables themselves can include corresponding fine controlled gain values in each entry. In other embodiments, controller 128 can be configured to subtract the unified gain value corresponding to the selected coarse controlled gain value above from the unified gain value obtained at block 505, and select a fine controlled gain value based on the result of the subtraction.

Following the example above, in which the unified gain value from block 505 is 40 and the selected coarse controlled gain value is 1 (e.g. 9 dB, corresponding to about 12 unified gain steps), the selected fine controlled gain value corresponds to a unified gain value of 28.

In embodiments such as that shown in FIG. 4, in which the fine amplification subsystem includes a plurality of subcomponents, controller 128 is also configured, once the fine controlled gain value has been selected at block 615, to decompose the selected fine controlled gain value into a control value for each of the plurality of VGAs 408. For example, controller 128 can retrieve a table from memory specifying a set of (four, in the present example) individual control values for each fine controlled gain value. A variety of control values are contemplated; in the example of Table 4, each VGA 408 receives one of eight values each corresponding to a 0.8 dB gain step. As in Table 3, it is also possible to store the gain values directly in Table 4.

TABLE 4

Fine Controlled Gain Value and Corresponding Control Values

| Fine Controlled Gain Value | VGA1 | VGA2 | VGA2 | VGA4 |
|---|---|---|---|---|
| 0 | 0 | 0 | 0 | 0 |
| 1 | 1 | 0 | 0 | 0 |
| 2 | 1 | 1 | 0 | 0 |
| 3 | 1 | 1 | 1 | 0 |
| ... | ... | ... | ... | ... |
| 63 | 8 | 8 | 8 | 8 |

Returning to FIG. 5, at block 515 controller 128 is configured to set the gain of the coarse and fine amplification subsystems based on the gain values selected at block 510 (including, if applicable, any control values). Thus, at block 515 controller 128 is configured to transmit control signals to coarse amplification subsystem 112 (e.g. LNA 112) and fine amplification subsystem 120 (e.g. VGAs 408).

Figure 7A:
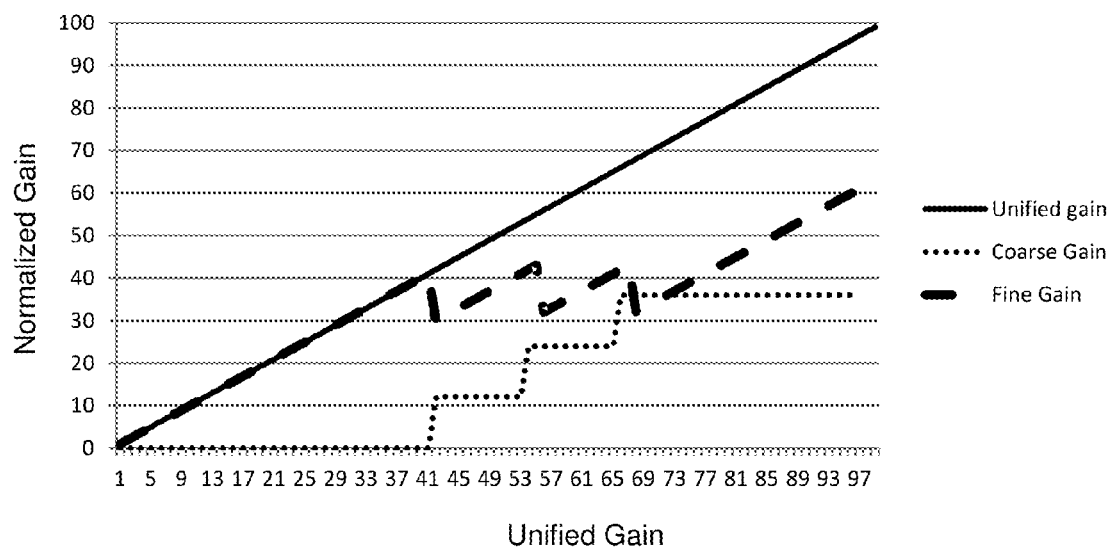
FIGS. 7A and 7B depicts example hysteretic gain control graphs, according to a non-limiting embodiment.
Figure 7B:
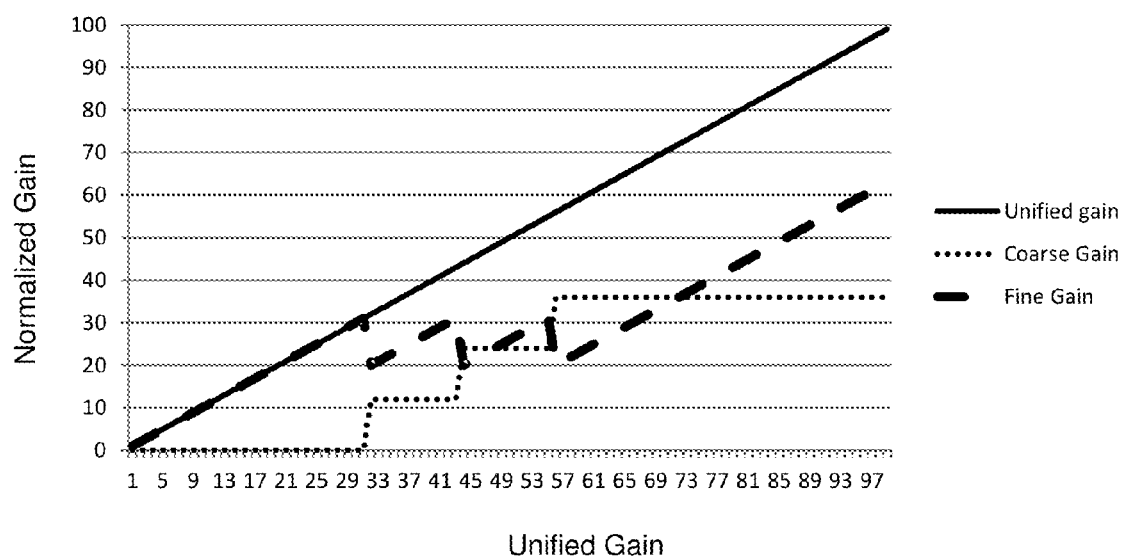

Turning to FIGS. 7A and 7B, example plots of coarse and fine controlled gain control for various unified gain values are shown, based on the tables discussed above. More specifically, FIG. 7A depicts the coarse and fine controlled gain values specified by the first ("up") map described above, while FIG. 7B depicts the coarse and fine controlled gain values specified by the second ("down") map described above. Hysteresis in the coarse and fine controlled gain values is evident in FIGS. 7A and 7B, based on which map is employed. The control of coarse and fine controlled gain in AGC system 108 transitions between the graphs of FIG. 7A and those of FIG. 7B depending on the direction of change in unified gain (i.e. to maintain the same coarse controlled gain value as long as possible).

A wide variety of maps can be implemented in AGC system 108, to change (or even eliminate) the degree of hysteresis. The above examples are provided solely for the purpose of illustration.

Referring again to FIG. 5, following the performance of block 515, controller 128 can return to block 505 to await the receipt or generation of another unified gain value. In addition, in some embodiments, controller 128 can implement offset control responsive to selection of the coarse and fine controlled gain values at block 510.

Specifically, at block 520, controller 128 is configured to select at least one offset control value based on the coarse controlled gain value selected at block 510. In the embodiment of FIG. 4, at block 520 controller 128 is configured to select an offset control value for each DAC 420. As will now be apparent to those skilled in the art, direct conversion of the carrier-modulated signal to a baseband signal via demodulator 116 can lead to self-mixing of the signal emitted by local oscillator 404. In particular, the output of LO 404 can leak to the output of LNA 112 and thus be provided to mixer 400 and mixed with LO 404 output. In addition, other components in AGC system 108, including VGAs 408, can introduce offset due to variations in component specifications, temperature and the like.

Controller 128 is configured to compensate for the above-mentioned offset by controlling the current emitted by each DAC 420, and thus applying an offset voltage at the respective outputs of mixer 400 and each of VGAs 408-1, 408-2, 408-3 and 408-4. At block 520, controller 128 is configured to select an offset control value for each DAC 420 from a lookup table, based on the coarse controlled gain value selected at block 510. Table 5 provides an example set of offset control values. Although the control values are shown as offset voltages, a variety of other values may also be employed. For example, Table 5 can contain current values, or index values with which controller 128 can retrieve current or voltage values from a separate table (not shown).

TABLE 5

Offset Control Values

| Coarse Controlled Gain Value | DAC 420-1 (mV) | DAC 420-2 (mV) | DAC 420-3 (mV) | DAC 420-4 (mV) |
|---|---|---|---|---|
| 0 | 2 | 1 | 0 | 0 |
| 1 | 4 | 2 | 1 | 0 |
| 2 | 7 | 4 | 2 | 1 |
| 3 | 11 | 6 | 3 | 1 |

At block 525, controller 128 is configured to set offset compensation subsystem 132 based on the offset compensation values selected at block 520.

It will be apparent from the above that offset compensation subsystem 132 is a feed-forward system. That is, offset compensation subsystem 132 is controlled not based on measurements of offset resulting from the gain values selected at block 510, but rather on expected offset caused by the gain values selected at block 510. The values retrieved from memory by controller 128 are generated prior to the performance of method 500. For example, the values in Table 5 can be refreshed via a calibration process (in which offset at each control point is measure) every time AGC system 108 starts up.

Figure 8:
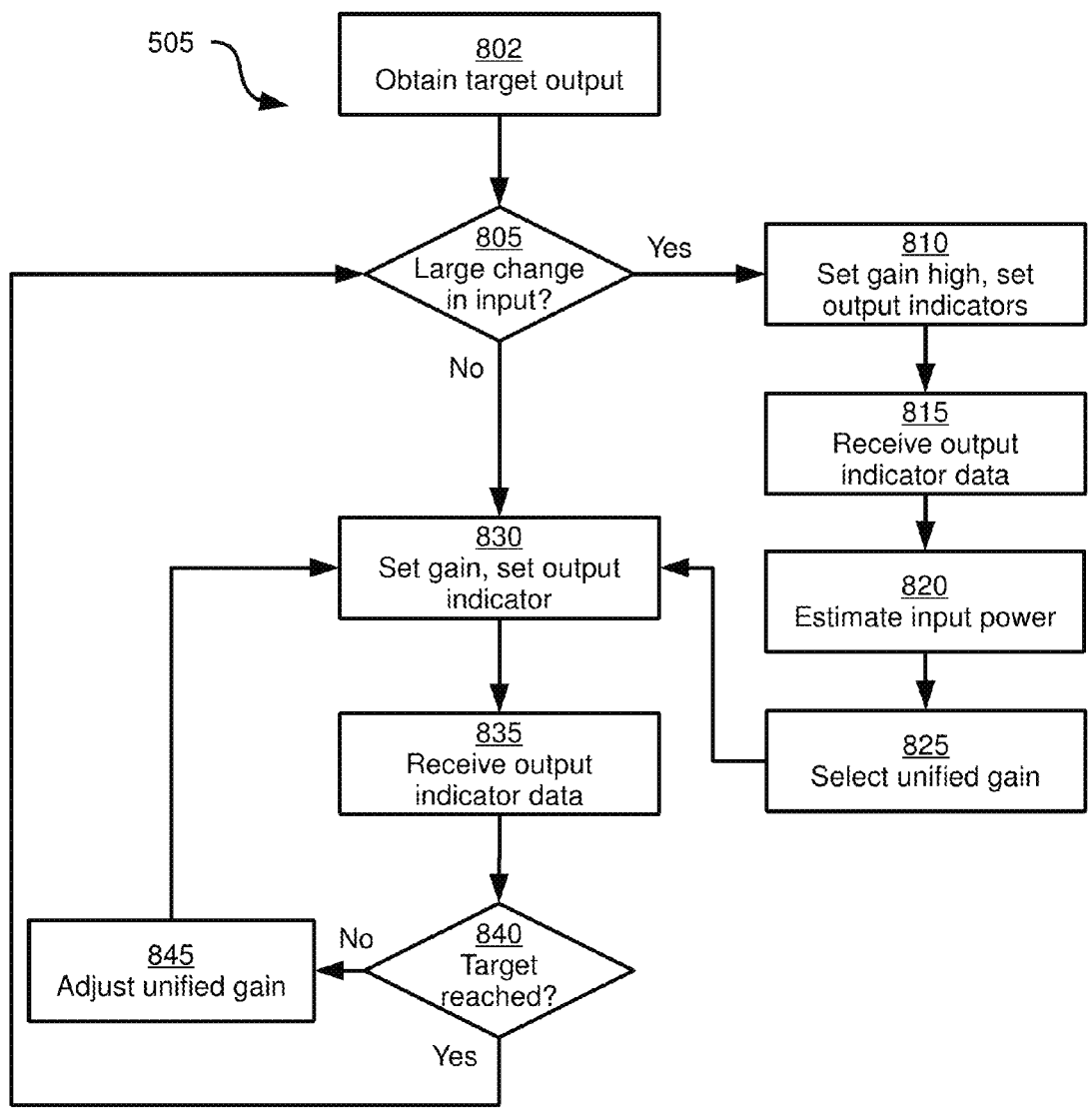
FIG. 8 depicts an example unified gain generation process, according to a non-limiting embodiment.

As mentioned earlier, obtaining a unified gain value at block 505 can be accomplished by receiving the unified gain from another component, such as baseband processor 124, or by generating the unified gain at controller 128. Turning now to FIG. 8, a method 800 of automatic gain control in which the unified gain is generated at controller 128 is depicted.

Beginning at block 802, controller 128 obtains a target output level (e.g. a target power for the amplified baseband signal emitted from VGA 408-4). The determination of a target can be made in a variety of ways that are not the subject of the present specification.

At block 805, controller 128 is configured to determine whether a change in the input signal envelope (e.g. as measured at output indicator 416-1) that exceeds a predetermined (and configurable) threshold has occurred. When the determination at block 805 is affirmative, controller 128 can be configured to perform a "fast acquisition" process. At block 810, controller 128 is configured to set the gain of AGC system 108 to maximum.

Controller 128 is also configured to set thresholds at the output indication subsystem. In particular, referring to the embodiment of FIG. 4, controller 128 is configured to set at least one threshold voltage at the peak detector of each output indicator 416. In the present example, controller 128 is configured to set two threshold voltages at each peak detector, corresponding to one third, and two thirds, respectively, of the full amplitude swing of AGC system 108. Other threshold values can also be employed, however.

At block 815, controller 128 is configured to receive output indicator data. In general, the output indicator data indicates an amplitude of the signal measured by each output indicator 416. More specifically, in the embodiment of FIG. 4, the output indicator data can include a two-bit value received from each output indicator. Each two-bit value can be generated by the comparators, and includes a first bit indicating whether the first peak set at block 810 (e.g. one third of full amplitude) has been reached, and a second bit indicating whether the second peak set at block 810 (e.g. two thirds of full amplitude) has been reached. Thus, in the embodiment of FIG. 4, controller 128 can receive a set of five bit pairs. The five bit pairs together form a 10-bit thermometer code.

In some embodiments, controller 128 can be configured to determine, between blocks 815 and 820, whether the received output indicator data exceeds a configurable threshold, beyond which estimation of input signal strength is unreliable. For example, if the thermometer code mentioned above is [1,1; 1,1; 1,1; 1,1; 1,1], controller 128 can be configured to return to block 810 and reduce the gain by a predetermined amount.

At block 820, controller 128 is configured to determine an estimated input power based on the output indicator data received at block 815. As will now be apparent, the signal increases in amplitude following LNA 112 and each VGA 408. The increasing signal will cross the thresholds monitored by the peak detectors at different points depending on the original strength of the signal. For example, the thermometer code of [0,0; 0,0; 0,0; 0,1; 1,1] is indicative of a lower initial signal strength than the thermometer code [0,1; 1,1; 1,1; 1,1; 1,1]. Controller 128 can determine the estimated input power by retrieving a lookup table from memory than includes an input power estimate for each thermometer code. In the example discussed above, where each VGA stage has a total gain of about 12.5 dB, the above estimation process yields an estimate of the input signal that is accurate to within about 6 dB.

Following retrieval of an estimated input power, controller 128 is configured to select a unified gain corresponding to the estimated input power. For example, controller 128 can simply divide the target output obtained at block 800 by the estimated input power from block 820 to obtain the unified gain at block 825.

When the determination at block 805 is negative, or when the performance of block 825 is complete, controller 128 can be configured to perform a gain adaptation process, beginning at block 830. At block 830, controller 128 is configured to set the coarse and fine controlled gain (either at the values selected at block 825, based on the process shown in FIG. 6, or by selecting a minimum or maximum gain). Controller 128 is also configured to set a reference voltage for the final output indicator 416 (416-5), corresponding to the target obtained at block 800. In some embodiments, in setting a gain selected at block 825, controller 128 can be configured to perform a variation of block 610 as described above. In particular, controller 128 can be configured, rather than selecting the coarse controlled gain value that matches the previous coarse controlled gain value, to select the coarse controlled gain value from the map that provides the greatest distance between the selected coarse controlled gain value and the next change in coarse controlled gain value. For example, given a unified gain of 40, the mappings shown above in Tables 1 and 2 provide coarse controlled gain values of 0 and 1. However, Table 1 requires a change in coarse gain after only two more unified gain steps, whereas Table 2 requires a change in coarse gain after four more unified gain steps. The mapping of table 2 would therefore be selected in this example, as it reduces the likelihood of a further change in coarse gain control being required during gain adaptation. In general, greater degrees of overlap between the subset of unified gain values in the maps that correspond to a given coarse controlled gain value increase the ability of controller 128 to select a coarse controlled gain value that will not result in an imminent coarse gain change during adaptation.

At block 835, controller 128 is configured to receive output indicator data, such as a digital value from the comparator of output indicator 416, indicating whether the target reference set at block 830 has been reached. At block 840, controller 128 is configured to determine whether the target has been reached based on the data received at block 835. When the target has not been reached, controller 128 is configured to increment or decrement the unified gain, and repeat the performance of blocks 830, 835 and 840. Whether the unified gain is incremented or decremented at block 845 depends on the nature of the output indicator data. For example, two references can be set at output indicator 416-5, bracketing the target obtained at block 800. The nature of the two-bit value received from output indicator 416-5 indicates whether the current output is too high or too low.

The adjustment at block 845 can be made by single unified gain steps, or by multiple steps. In some embodiments, the number of unified gain steps adjusted at block 845 can vary dynamically, based on a record of recent adjustments. In some performances of blocks 835-845, particularly those which were preceded by the performance of blocks 810-825 (that is, the "fast acquisition" process), the performance of blocks 835-845 can be repeated for a configurable period of time. For example, the period of time can be selected such that controller 128 is configured to cease the performance of blocks 835-845 (that is, to cease adapting the gain of AGC system 108) before or at the end of the STF portion of an incoming packet.

When the determination at block 840 is affirmative, the performance of method 505 returns to block 805. In some embodiments, controller 128 can instead be configured to enter a hold state at which no further adjustments to gain are made until an affirmative determination at block 805.

In other embodiments, in which baseband processor 124 provides controller 128 with a unified gain value, blocks 835, 840 and 845 can be omitted. That is, controller 128 can be configured to simply implement the unified gain values received from baseband processor 124, unless a significant change in input signal is detected, in which case controller 128 can perform the above-mentioned fast acquisition process.

Various advantages to the above systems and methods will occur to those skilled in the art. For example, the use of unified gain that is decomposed (locally at controller 128)

into coarse and fine controlled gain values permits simplified gain control. For example, in embodiments in which baseband processor 124 sends unified gain values to controller 128, an interface (e.g. a set of GPIO pins) need only be provided between baseband processor 124 and controller 128 sufficient to pass a single value (or, in some embodiments, a simple instruction to increment or decrement).

Further, the use of hysteretic mappings of unified gain to coarse and fine controlled gain values, in addition to the use of coarse controlled gain values for coarse amplification subsystem 112 (which reduce the frequency with which coarse amplification subsystem 112 is adjusted), can reduce the frequency with which both coarse amplification subsystem 112 and fine amplification subsystem 120 are adjusted simultaneously. Simultaneous adjustment can cause a loss of monotonicity in the overall gain response of AGC system 108, and thus reducing the frequency of simultaneous adjustment can preserve monotonicity to a greater degree.

In addition, the performance of a fast acquisition process, as well as feed-forward offset control such as those discussed above can increase the response speed of AGC system 108 without significantly increasing complexity.

The scope of the claims should not be limited by the embodiments set forth in the above examples, but should be given the broadest interpretation consistent with the description as a whole.

We claim:

1. A wireless receiver, comprising:
    a coarse amplification subsystem configured to receive a carrier-modulated signal from an antenna and amplify the carrier-modulated signal;
    a demodulator connected to the coarse amplification subsystem and configured to generate a baseband signal from the amplified carrier-modulated signal;
    a fine amplification subsystem connected to the demodulator and configured to amplify the baseband signal;
    an offset compensation subsystem including at least one digital-to-analog converter (DAC) connected to at least one of a demodulator output and a fine amplification subsystem output;
    a memory storing a set of feed-forward offset compensation control values; and
    a controller connected to the coarse amplification subsystem, the fine amplification subsystem, the offset compensation subsystem and the memory, the controller configured to:
        obtain a coarse gain value for controlling the coarse amplification subsystem, and a fine gain value for controlling the fine amplification subsystem;
        based on the coarse gain value, retrieve an offset control value from the set of feed-forward offset compensation control values in the memory;
        control the at least one DAC based on the retrieved offset control value; and
        control the coarse amplification subsystem and the fine amplification subsystem based on the coarse gain value and the fine gain value.

2. The wireless receiver of claim 1, the offset compensation subsystem including a plurality of DACs.

3. The wireless receiver of claim 2, the plurality of DACs comprising:
    a first DAC connected to the demodulator output to apply offset compensation to the baseband signal; and
    a second DAC connected to the fine amplification subsystem output.

4. The wireless receiver of claim 3, the fine amplification subsystem including a plurality of variable gain amplifiers (VGAs); the second DAC connected to an output of one of the VGAs.

5. The wireless receiver of claim 4, the plurality of DACs further comprising a third DAC connected to an output of a further one of the VGAs.

6. The wireless received of claim 5, the plurality of VGAs including four VGAs connected in series between the demodulator output and an output driver of the wireless receiver;
    the second DAC, the third DAC, and a fourth DAC connected, respectively, to the first, second and third VGAs following the demodulator.

7. The wireless receiver of claim 2, the set of feed-forward offset compensation control values comprising a record corresponding to each of a plurality of coarse gain values; each record including a control value for each of the DACs.

8. The wireless receiver of claim 7, the controller further configured to retrieve the offset control value by:
    selecting the record corresponding to the obtained coarse gain value; and
    retrieving the control values from the selected record.

9. The wireless receiver of claim 8, each offset control value defining one of an offset voltage and an offset current.

10. The wireless receiver of claim 8, each offset control value defining an index corresponding to one of an offset voltage and an offset current stored in the memory.

11. The wireless receiver of claim 8, the controller further configured to control the plurality of DACs by sending the control values to the plurality of DACs.

12. The wireless receiver of claim 1, the controller further configured to:
    responsive to start-up of the wireless receiver, perform a calibration process to update the set of feed-forward offset compensation control values.

13. The wireless receiver of claim 12, the controller further configured to perform the calibration process by:
    obtaining a measurement of offset from the demodulator output and the fine gain amplification subsystem output; and
    updating the set of feed-forward offset compensation control values based on the measurements.

14. A method in a wireless receiver having a coarse amplification subsystem configured to receive a carrier-modulated signal from an antenna and amplify the carrier-modulated signal, a demodulator connected to the coarse amplification subsystem and configured to generate a baseband signal from the amplified carrier-modulated signal, a fine amplification subsystem connected to the demodulator and configured to amplify the baseband signal, an offset compensation subsystem including at least one digital-to-analog converter (DAC) connected to at least one of a demodulator output and a fine amplification subsystem output, and a controller, the method comprising:
    storing a set of feed-forward offset compensation control values;
    obtaining a coarse gain value for controlling the coarse amplification subsystem, and a fine gain value for controlling the fine amplification subsystem;
    based on the coarse gain value, retrieving an offset control value from the set of feed-forward offset compensation control values in the memory;
    controlling the at least one DAC based on the retrieved offset control value; and controlling the coarse amplification subsystem and the fine amplification subsystem based on the coarse gain value and the fine gain value.

15. The method of claim 14, wherein the offset compensation subsystem includes a plurality of DACs and the set of feed-forward offset compensation control values includes a record corresponding to each of a plurality of coarse gain values, each record including a control value for each of the DACs, the method further comprising retrieving the offset control value by:
   selecting the record corresponding to the obtained coarse gain value; and
   retrieving the control values from the selected record.

16. The method of claim 15, each offset control value defining one of an offset voltage and an offset current.

17. The method of claim 15, each offset control value defining an index corresponding to one of an offset voltage and an offset current stored in the memory.

18. The method of claim 15, further comprising: controlling the plurality of DACs by sending the control values to the plurality of DACs.

19. The method of claim 14, further comprising:
   responsive to start-up of the wireless receiver, performing a calibration process to update the set of feed-forward offset compensation control values.

20. The method of claim 19, wherein performing the calibration process comprises:
   obtaining a measurement of offset from the demodulator output and the fine gain amplification subsystem output; and
   updating the set of feed-forward offset compensation control values based on the measurements.

* * * * *